United States Patent [19]

Motegi et al.

[11] Patent Number: 5,150,191
[45] Date of Patent: Sep. 22, 1992

[54] P-TYPE II-VI COMPOUND SEMICONDUCTOR DOPED

[75] Inventors: Nawoto Motegi, Kanagawa; Tsutomu Uemoto, Yokohama; Atsushi Kamata, Chigasaki; Hiroshi Mitsuhashi, Tokyo, all of Japan

[73] Assignee: Kabushiki Kaisha Toshiba, Kawasaki, Japan

[21] Appl. No.: 616,563

[22] Filed: Nov. 21, 1990

[30] Foreign Application Priority Data

Nov. 21, 1989 [JP]  Japan ................................. 1-300702
Feb. 13, 1990 [JP]  Japan ................................. 2-32145

[51] Int. Cl.$^5$ ............................................ H01L 29/227
[52] U.S. Cl. ............................... 357/61; 357/63; 357/17
[58] Field of Search ............ 357/61, 63, 16, 11; 252/62.3 Z T; 437/81, 965; 148/DIG. 63, DIG. 64

[56] References Cited

U.S. PATENT DOCUMENTS

| | | | |
|---|---|---|---|
| 3,549,434 | 12/1970 | Aven | 357/61 |
| 3,578,507 | 5/1971 | Chiang et al. | 357/61 |
| 3,670,220 | 6/1972 | Kun et al. | 357/61 |
| 4,868,615 | 9/1989 | Kamata | 357/61 |
| 4,904,618 | 2/1990 | Neumark | 148/DIG. 64 |

Primary Examiner—William D. Larkins
Attorney, Agent, or Firm—Oblon, Spivak, McClelland, Maier & Neustadt

[57] ABSTRACT

An optical semiconductor device is provided with a p-type ZnSe semiconductor layer. Si, Cl and O atoms are added, as dopants, to the ZnSe semiconductor layer. Associations of the Si, Cl and O atoms are formed to define a shallow acceptor level in the semiconductor layer. Each of the associations comprises one Si atom, one Cl atom and one O atom by which the lattice points of Se are displaced between those crystal lattice points in the semiconductor layer which are adjacent to one another.

20 Claims, 5 Drawing Sheets

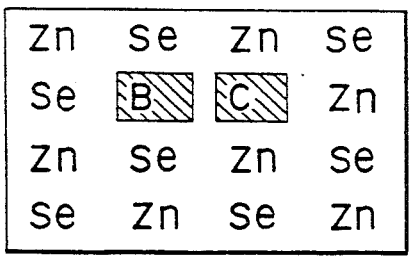
F I G. 1A
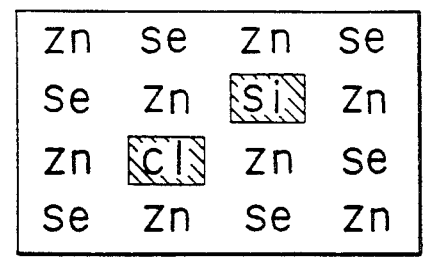
F I G. 1B
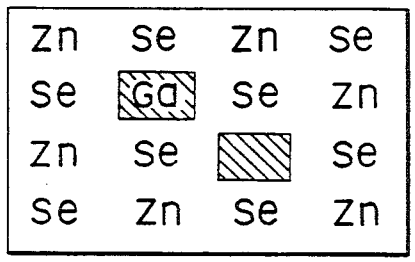
F I G. 1C
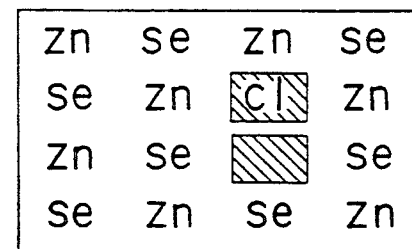
F I G. 1D
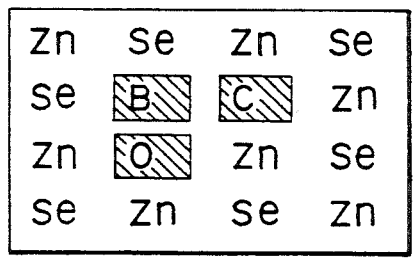
F I G. 2A
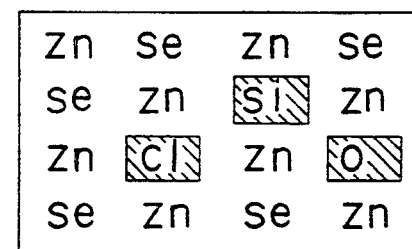
F I G. 2B
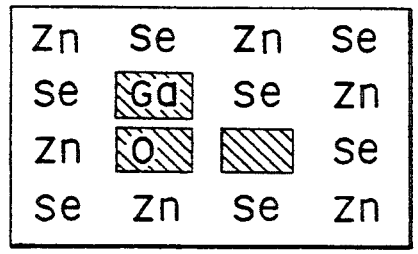
F I G. 2C
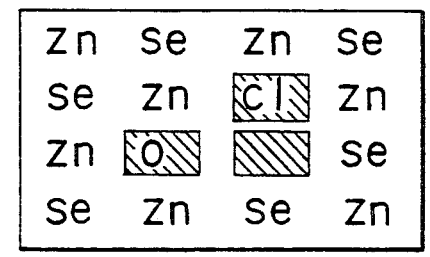
F I G. 2D

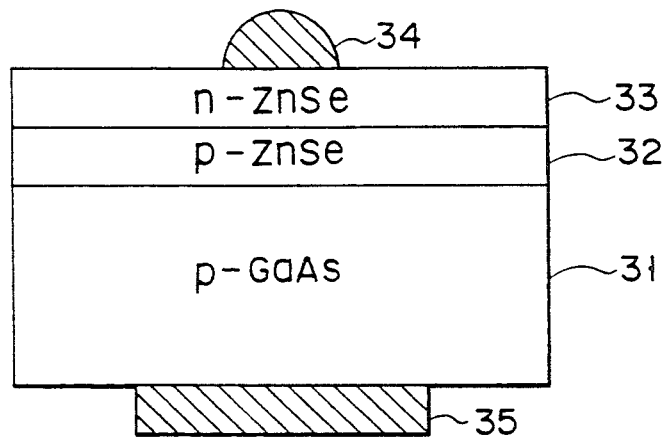
F I G. 6
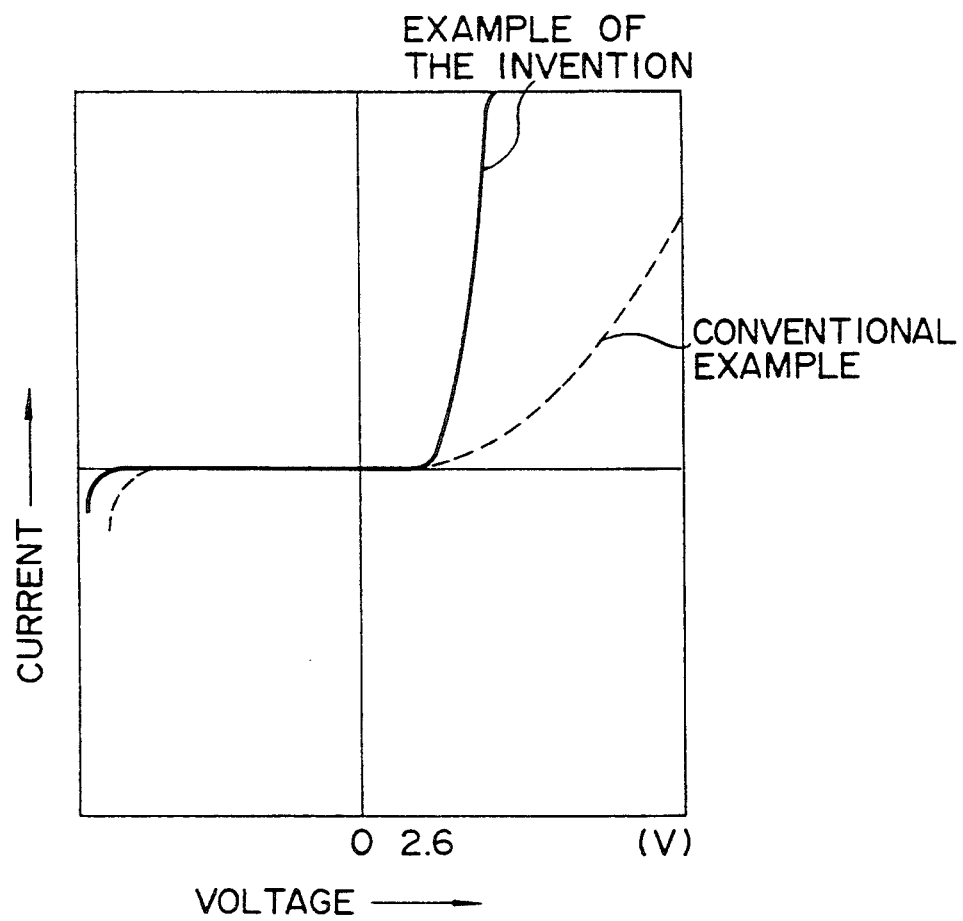
F I G. 7

P-TYPE II-VI COMPOUND SEMICONDUCTOR DOPED

BACKGROUND OF THE INVENTION

1. Field of the Invention

The present invention relates to a semiconductor device in which group II-VI compound semiconductors are used and, more particularly, it relates to a semiconductor device which includes a group II-VI compound semiconductor layer of the p-conductive type.

2. Description of the Related Art

Some group II-VI compound semiconductors including ZnS, ZnSe and the mixed crystal of ZnS and ZnSe have a relatively wider forbidden band, as compared with those of other well-known semiconductors. Therefore, attention has recently been paid to these group II-VI compound semiconductors as materials by which various optical semiconductor devices including light-emitting diodes, semiconductor lasers and photodiodes which emit light ranging from visible radiation to ultraviolet may be made.

In order to make these optical semiconductor devices, it is necessary to form a p-type conductive layer high in carrier density but low in resistance. According to the most popular knowledge about controlling the type of conductivity of the semiconductor, group I or V atoms are suitable for use as p-type impurities for the group II-VI compound semiconductors. Although various crystal growths have been tried and various impurities have been added, a p-type conductive layer high in carrier density and low in resistance has not yet been made in the case of the group II-VI compound semiconductors whose forbidden band is wide. The above-mentioned optical semiconductor devices cannot be made yet using the group II-VI compound semiconductors of wide forbidden band.

The tendency that it becomes more difficult to form the p-type conductive layer of high carrier density as the forbidden band becomes wider is not inherent solely in the group II-VI compound semiconductors but commonly found in group III-VI compound semiconductors. It has been supposed that this phenomenon is due to the self-compensating effect in which the energy stabilizing effect created by electrons accepted and given between impurities added and defects inherent in the crystal formed becomes larger than energy loss needed to create the inherent defects as the forbidden band becomes wider. This effect is essential and it has therefore been regarded as being impossible that the p-type conductive layer of high carrier density can be made by the group II-VI compound semiconductors of wide forbidden band because of the self-compensating effect.

However, it has been quite recently confirmed that the p-type conductive layer can be made by adding group I or V atoms even in the case of ZnSe and that the self-compensating effect can be avoided. A notable example telling us that the p-type conductive layer of high carrier density could be made by adding Li atom of the group I to ZnSe can be found in Yasuda, et al, "Metalorganic vapor phase epitaxy of low-resistivity p-type ZnSe", Applied Physics Letter, Vol. 52, page 57 (1988). According to this essay, an Li-added ZnSe layer was epitaxial-grown on the crystal of a GaAs substrate at a temperature of 450° C. according to the MOCVD method and a p-type layer having a carrier density of $3 \times 10^{16} - 9 \times 10^{17}$ cm$^{-3}$ was made. This carrier density reported was obtained by the measurement of Hall effect and in the case of measuring the Hall effect about a crystal of heterojunction having the ZnSe layer piled on the GaAs, the carrier density is measured higher than its true value because of the inter-diffusion of atoms at the border face of the heterojunction and the effect of secondary electron gases. It was therefore a little doubtful whether or not the high carrier density of $9 \times 10^{17}$ cm$^{-3}$ was true. However, DePuydt, et al, "Electrical characterization of p-type ZnSe", Applied Physics Letter, Vol. 55, page 1103 (1989) reports that a p-type conductive layer having a carrier density of $1 \times 10^{17}$ cm$^{-3}$ or lower can be made when the same Li-added ZnSe layer is grown according to the MBE (or Molecular Beam Epitaxial) method, and it has been confirmed that the p-type conductive layer can be made to have a relatively high carrier density when the ZnSe crystal is formed by adding Li to it.

However, it is well-known that the Li atom is an impurity quite easily diffused, and Cheng, et al, "Growth of p- and n-Type ZnSe By Molecular Beam Epitaxy," Journal of Crystal Growth, Vol. 95, page 512 (1989) concretely reports that the Li atoms diffuse even in the course of crystal growth and that it is difficult to control them so as to be distributed in the crystal as desired. The same test result was obtained by inventors of the present invention. Further, they have found that abnormal diffusion of Li atoms is caused and the Li atoms are remarkably piled on the border face of BaAs relative to ZnSe in the course of the crystal growth of the Li-added ZnSe on BaAs, and that the rate or activating rate of those electrically-active impurity atoms which are included in Li atoms taken into the crystal and which create p-type carriers (or holes) is by far lower than the predicted value or only about one tenth at the highest. It has become apparent, therefore, that Li atom is not proper as the impurity to form the p-type ZnSe layer.

A further example of growing the p-type ZnSe layer with N atoms added is reported by Ohki, et al, "Nitrogen Doped p-Type ZnSe Layer Grown by Metalorganic Vapor Phase Epitaxy", Japanese Journal of Applied Physics, Vol. 27, No. 5, page L909 (1988). The p-type carrier density reported in this case is $10^{14}$ cm$^{-3}$ at the highest and this value is too low to practically use the p-type ZnSe layer. It is said that the thermal equilibrium solid solubility of N atoms relative to the group II-VI compound semiconductors such as ZnSe is extremely small and it is therefore natural that the p-type carrier density is so low when N atoms are added. The attempt of advancing the crystal growth of ZnSe while cracking ammonium, which is used as the N atom material, is disclosed in Taike, et al, "P-type conductivity control of ZnSe highly doped with nitrogen by metalorganic molecular beam epitaxy", Applied Physics Letter, Vol. 56, page 1989 (1990) is reasonable as a non-thermal equilibrium method of taking into the crystal those N atoms which are difficulty taken into the crystal from the viewpoint of thermal equilibrium. It is reported in this essay that a p-type carrier density of $5.6 \times 10^{17}$ cm$^{-3}$ was realized as the result of this attempt. Because the carrier density was measured in relation to the Hall effect and test results which were not matched with the high p-type carrier density are shown in this essay, it is quite doubtful whether or not the p-type conductive layer whose carrier density was about $10^{17}$ cm$^{-3}$ was truly obtained by adding N atoms. In fact, no report that these test results or the high p-type carrier density of about $10^{17}$ cm$^{-3}$ realized by the addition of N atoms has been confirmed has as yet been presented.

It is difficult to form the p-type group II-VI compound semiconductor layer, suitable for practical use, by atoms of the groups I and V which are supposedly optimum according to the conventional knowledge, but it is recently reported that the p-type ZnSe layer having a relatively high carrier density was obtained by adding O (or oxygen) atoms which belong to the same group as S and Se. According to common sense until now, however, O atoms added to the ZnSe layer displace Se atoms in the crystal, form only those electron states which are called isoeletronic traps, and cannot become shallow acceptor levels which create p-type carriers. It is however reported in Akimoto, et al, "Electroluminescence in an Oxygen-Doped ZnSe p-n Junction Grown By Molecular Beam Epitaxy", Japanese Journal of Applied Physics, Vol. 28, No. 4, April, 1989, page L531 that an O-atom added ZnSe layer was grown on the GaAs substrate according to the MBE method, that the p-type layer having a carrier density of $1.2 \times 10^{16}$ cm$^{-3}$ was thus obtained and that the pn junction was formed to make a diode of the injection current light emitting type. The author of this essay insists that the reason why p-type carriers were obtained by adding O atoms resides in that the O atoms themselves formed shallow acceptor levels. The O atom is not an impurity so easily diffused as the Li atom of the group I is. Further, it is supposed that the O atom belongs to the same group as Se and that it is higher in solid solubility as compared with atoms of the group V. If the O atom can become the p-type impurity, it will become unexpectedly suitable for forming the p-type layer with group II-VI compound semiconductors. However, the blue light emitting diode reported in this essay has high operating voltage and current of 3.5V and 200mA, respectively, and it is operated only at a cryogenic temperature of 77K. It cannot help saying therefore that this diode is quite insufficient from the viewpoint of practical use.

As described above, the optical semiconductor devices such as the light-emitting diode, semiconductor laser and photodiode which made it necessary to form the pn junction with the p-type layer having a relatively high carrier density could not be made according to the conventional technique, using the group II-VI compound semiconductors of wide forbidden band. This is because it is relatively difficult to form the p-type layer, which has such a carrier density as needed, with these group II-VI compound semiconductors of wide forbidden band and also because the pn junction cannot be formed because of the quite fast diffusion of the impurity atoms even when the p-type layer is made to have a carrier density near to the value needed.

SUMMARY OF THE INVENTION

The present invention is therefore intended to eliminate the above-mentioned drawbacks and the object of the present invention is to provide a group II-VI compound semiconductor of wide forbidden band and a method for the same capable of realizing a sufficiently high p-type carrier density but preventing the p-type impurities from abnormally diffusing into the crystal. There can be thus provided optical semiconductor devices for which the group II-VI compound semiconductors each having a pn junction more excellent in characteristics are used as materials and which include the light emitting diode having a higher light emitting efficiency, the semiconductor laser having a lower threshold value and the photodiode having a higher switch-over efficiency.

According to a first aspect of the present invention, at least a group III, VII, or IV atom, or atoms of the groups III and IV or atoms of the groups IV and VII is (or are) added to the group II-VI compound semiconductor which is to form the p-type layer having a higher carrier density. In a case where the p-type layer is made to have a carrier density of $1 \times 10^{17}$ cm$^{-3}$, each of the impurities added to the p-type layer has a carrier density larger than at least $1 \times 10^{17}$ cm$^{-3}$.

According to a second aspect of the present invention, oxygen atom is added as an impurity to the group II-VI compound semiconductor, which is to form the p-type layer having a higher carrier density, together with the group III, VII or IV atom, or atoms of the groups III and IV, or atoms of the groups IV and VII. The density of the oxygen atoms added to the p-type layer is larger than $1 \times 10^{17}$ cm$^{-3}$. In a case where the impurities added to the p-type layer are either of atoms of the groups III and IV or atoms of the groups IV and VII, the density of the group IV atoms is substantially equal to or larger than that of atoms of the group III or VII.

According to a third aspect of the present invention, a method of making then group II-VI compound semiconductors with which the p-type layer having a higher carrier density is to be formed comprises advancing the crystal growth while using, as impurity materials added, molecules or molecule ions in which atoms of the groups III and IV or atoms of the groups IV and VII are combined with each other.

According to a fourth aspect of the present invention, a method of making the group II-VI compound semiconductors comprises advancing the crystal growth while using, as impurity materials added to the group II-VI compound semiconductor layer with which the p-type layer having a higher carrier density is to be formed, molecules or molecule ions in which the group II atom, the group VII atom and oxygen atom, the group IV atom and oxygen atom, atoms of the groups III and IV and oxygen atom, or atoms of the groups IV and VII and oxygen atom are combined with each other or one another.

According to a fifth aspect of the present invention, a method of making the group II-VI compound semiconductor layer is carried out under the condition that the supply ratio of the group VI material relative to the group II material (or VI/II ratio) is set larger than 1.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1D are plans showing the crystal lattices of group II-VI compound semiconductor layers according to the present invention;

FIGS. 2A through 2D are plans showing the crystal lattices of other group II-VI compound semiconductor layers according to the present invention;

FIG. 6 is a sectional view showing the component structure of a third light-emitting diode according to the present invention;

FIG. 7 is a chart showing current/voltage characteristics of the conventional diode and of the third diode according to the present invention;

DETAILED DESCRIPTION OF THE PREFERRED EMBODIMENTS

Figure 3:
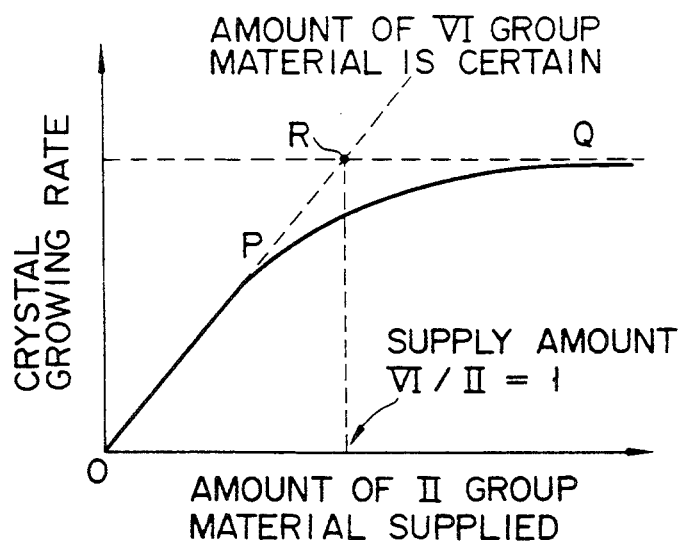
FIG. 3 is a characteristic graph showing how the crystal growth rate changes when the amount of material supplied is changed.

Inventors of the present invention have earnestly studied the crystal growth of group II-VI compound semiconductors such as ZnSe and ZnS having a wide forbidden band. As the result, they have found that a p-conductive layer having a carrier density larger than $10^{15}$ cm$^{-3}$ can be made when group III atoms such as B, Al and Ga, group VII atoms such as Cl, Br and I, group IV atoms such as C, Si and Ge, atoms of groups III and IV, or atoms of groups IV and VII are added as impurity atoms to the group II-VI compound semiconductors. They have also found that the p-carrier density increases when the crystal growth of the group II-VI compound semiconductors is advanced using as the impurity materials added those molecules or molecule ions which include atoms of groups III and IV or group IV and VII as their components in the case where these atoms are added as the impurity atoms to the semiconductors.

Further, they have found that the p-carrier density remarkably increases when oxygen atoms are added to the group II-VI compound semiconductors together with such impurity atoms as group III atoms, group VII atoms, atoms of groups III and IV, or atoms of groups IV and VII. In the case where this p-layer is to be grown, the inventors of the present invention have found that the p-carrier density remarkably increases when those molecule or molecules ions in which group III atoms are combined with oxygen atoms, group VII atoms with oxygen atoms, group IV atoms with oxygen atoms, atoms of groups III and IV with oxygen atoms, or atoms of groups IV and VII with oxygen atoms. Still further, they have found that the p-carrier density also remarkably increases when the ratio of the group VI and group II materials supplied (or VI/II ratio) is set larger than 1 in the case where the p-layer is to be grown by adding group III atoms, group VII atoms, group IV atoms or atoms of groups VI and II to the group II-VI compound semiconductors.

It is well-known that the group II-VI compound semiconductors to which the group III or VII group atoms have been added usually have p-conductivity and this tells us that the atoms of group III or VII which have been added to the group II-VI compound semiconductors displace lattice points of the group II and VI compounds to behave as impurities of the donner type. From their test result which shows that the p-conductivity is created under a certain condition even in the case where atoms of the group III or VII which are impurities of the donner type are added to the group II-VI compound semiconductors, and also from their consideration about this test result, the inventors of the present invention have derived the following conclusion. Namely, atoms of the group III or VII combine with other impurity atoms and intrinsic faults to become complex centers and form shallow acceptor levels which are relatively small in ionization energy. And in the case where oxygen atoms are added, the oxygen atoms are further associated to lower the ionization energy of the acceptor level resulting from their complex centers, thereby increasing the p-carrier density.

A group II vacancy in the group II-VI compound semiconductors serves as a double acceptor for catching two electrons. The group II vacancy is likely to diffuse into the semiconductor and it hardly happens therefore that this vacancy is present in the crystal as a single one. When the group III atoms by which the lattice points of the group II are displaced or group VII atoms by which the lattice points of the group VI are displaced are present as donners, however, the group II vacancy associates with the donner between those lattice points which are adjacent to each other to become stably present in the crystal. The complex center which is formed when the group II vacancy associates with the donner serves as an acceptor for catching one electron and behaves as an excellent light-emitting center. It is therefore called A center. The complex center of the donner and the group II vacancy is often compensated by excessively-present donners and it is a relatively shallow acceptor of 0.6eV. Therefore, it was not usually supposed to be the center for creating the p-carrier. However, the inventors of the present invention have found that the p-layer having a carrier density larger than $10^{15}$ cm$^{-3}$ can be created when it is grown under the condition that the ratio of the group VI and II atoms supplied is larger than 1 or it is heat-processed at a temperature higher than 600° C. in an ampoule into which the group VI atoms have been added after it is grown even in the case where only the group III or VI atoms are intendedly added in the course of growing the crystal of the group II-VI compound semiconductors. It has been found from this that if a sufficient amount of the group II vacancies or the group II vacancies which are substantially same in density as the donners are introduced into the semiconductor, it will never happen that the complex center acceptors are compensated by the remaining donners to thereby sufficiently create the p-carriers.

The group IV atoms by which the lattice points of the group VI atoms are displaced serve as double acceptors similarly to the case of the group II vacancies, but different from the group II vacancies, the group IV atoms are stably present, as a single one, in the semiconductor layer. When ZnSe was grown using, as the group VI material, dimethyl selenium which is the organic compound of Se and under the condition that the rate of supply speed of the group VI material relative to the group II material was larger than 1, the p-layer was formed. The reason why C atoms of $10^{18}$ cm$^{-3}$ were found in the p-layer in this case is that the C atoms which were the group IV atoms displaced the lattice points of the group VI atoms to form an acceptor level. The reason why the C atoms which were the group IV atoms displaced the lattice points of the group VI atoms although the crystal growth was developed in an atmosphere of excessive group VI atoms and under the condition that the group II vacancies could be easily created is that the energy stabilizing effect which is far larger than the effect of the number of vacant lattice points is created by the group IV atoms which displace not the group II lattice points but the group VI lattice points. Similarly to the case of the group II vacancies, the group IV atoms which have displaced the group VI lattice points cooperate with the donners of the group III atoms which have displaced the group II lattice points or of the group VII atoms which have displaced the group VI lattice points to form complex centers so as to create an acceptor level for catching one electron. It is therefore supposed that the p-carriers were created even when only the group IV atoms were added and they were added together with the group III or VII atoms.

When the density of those complex centers which are formed by the donners and the group II vacancies is lower than the density of those donners which associate with the group II vacancies to form complex centers, the acceptor level which the complex centers of the donners and the group II vacancies form is compensated by electrons of the donners. The case where the p-carriers are created by adding the group III or VII atoms is limited to a case where the group II vacancies are sufficient in number. The fact that a high p-carrier density was attained by adding the group III or VII atoms in the case where the crystal growth was developed under the condition that the ratio or effective supply rate of the group VI material relative to that of the group II material was larger than 1 and in the case where the p-layer was heat-processed at high temperature in the atmosphere of excessive group VI atoms tells us that it is essentially important to form the group II vacancies whose density is same as that of the donners. Similarly, the high p-carrier density attained when the group II atoms are added together with the group III or VII atoms is in those cases where the complex center acceptors are not compensated by the remaining donners and where the density of the group IV atoms taken into the crystal is substantially equal to or higher than the density of the group III or VII atoms.

It has been found that the p-carrier density remarkably increases in the case where impurity atoms such as the group III atoms, group IV atoms, atoms of the groups IV and III or atoms of the groups IV and VII are added together with oxygen atoms which have a density equal to or higher than that of these impurity atoms. The oxygen atom, similar to atoms of S and Se, belongs to the group VI and these atoms of the same group form a localized electron level but this level is active only in the optical aspect and called isoelectronic trap. Therefore, it is not supposed that they form an acceptor level which is small in ionization energy. Considering this together with the fact that the p-conductivity is attained not by adding only the oxygen atoms to the group II-VI compound semiconductor such as ZnSe but by adding the oxygen atoms to it together with the group III, VII or IV atoms, it is reasonable to think that the oxygen atoms themselves do not form the acceptor level but that they have the effect of lowering the ionization energy of the acceptor level which is formed when the group III, VII or IV atoms are added. It is well-known that the oxygen atom has a larger electro-negativity as compared with atoms of S and Se. When an acceptor-like complex center is formed by the group III atom and the group II vacancy, the group VII atom and the group II vacancy, atoms of the groups IV and III, or atoms of the groups IV and VII groups and another center is formed by the oxygen atom associated with these atoms, therefore, the oxygen atom attracts more electrons as compared with the atoms of S and Se around it. It is therefore supposed that the increment of potential energy with which the acceptor-like complex center catches electrons or acceptor ionization energy is reduced by such an extent that corresponds to the excessive electrons which are attracted by the oxygen atom. This effect of the oxygen atom which lowers the acceptor ionization energy is naturally created even at the complex center of the group IV atom and the oxygen atom.

Shallow acceptor levels are formed by atoms of the groups IV and III (FIG. 1A), atoms of the groups IV and VII (FIG. 1B), the group III atom and the group II vacancy (FIG. 1C), or the group VII atom and the group II vacancy (FIG. 1D), as shown in FIGS. 1A through 1D). It is supposed to be in a case where these impurities and the vacancies are associated with each other between the allowable nearest lattice points that the shallow acceptor levels are formed by the impurities and the vacancies. Further, it is in a case where the acceptor and the oxygen atom are associated with each other between those lattice points which are also adjacent to each other that the ionizing energy of the acceptor is lowered when these complex centers and the oxygen atom are associated.

Even in a case where the density of impurity atoms is relatively high, that is, $10^{18}$ cm$^{-3}$, the rate of the number of the impurity atoms relative to the number of lattice points is about 1/10,000 and in a case where impurity atoms more than two kinds are taken into the crystal independently of the other, the probability that these impurity atoms occupy those lattice points which are adjacent to each other and associate with each other is quite small. When the crystal growth is developed using molecules or molecule ions which include as their component atoms those atoms which are included in the complex center to be formed, or when molecules or molecule ions which include, as their component atoms, atoms of the groups IV and III, or of the groups IV and VII, the group III and oxygen atoms, the group VII and oxygen atoms, the group IV and oxygen atoms, atoms of the groups IV and III and the oxygen atom, or atoms of the groups IV and VII and the oxygen atom are used as the impurity materials added, the p-layer having a high carrier density can be formed. This is because the probability that the impurity atoms associate with each other between the adjacent lattice points becomes by far higher, as compared with a case where different materials are used, even in the case where the impurity atoms are not taken into the crystal while keeping their union in a material state.

In the case where p-type layer was grown by adding the impurity atoms such as the group III, VII or IV atom, or atoms of the groups IV and III, or atoms of the groups IV and VII to the semiconductor, or by adding the oxygen atom in addition to the impurity atoms to it, it was useful in any case for gaining a high p-carrier density that the effective supply ratio of the group II material relative to the group VI material was set larger than 1. It is supposed that this is because the group II vacancy is formed when the crystal growth is developed under the condition that the effective supply ratio of the group II material relative to the group VI material is set larger than 1. The group II vacancy easily associates with the donner-like impurity to form an acceptor level. The acceptor level thus formed serves directly to create the p-carrier in a case where the p-layer is realized by adding the group III or VII atoms to the semiconductor, but even if not, it is supposed that the group II vacancy acts effectively on preventing it from associating with various donners which remain in the crystal and these remaining donners from compensating those shallow acceptors which create directly the p-carriers. It is supposed that the effect of making the donner at the group II vacancy inactive also acts on making those donner-like levels which dislocation and localized dislocation in the crystal can form inactive.

It is supposed useful for forming the p-layer of high carrier density that sufficient amount of the group II vacancies is introduced into the crystal. It is however difficult to measure and value the vacancy density of about $10^{18}$ cm$^{-3}$ in a thin film of crystal. It is therefore difficult to make it apparent from tests what density of the group II vacancies is needed. However, it was possible to determine the condition needed to form the p-layer of high carrier density by the effective supply ratio of the group II material relative to the group VI material which had close relation to the density of the group II vacancies created in the crystal.

The crystal of the group II-VI compound semiconductors keeps relatively accurately the ratio of the group II atoms relative to the group VI atoms 1 to 1 in stoichiometry. The crystal growth develops taking those atoms which adhere to the growing crystal surface into the solid successively. Even in a case where the substantial supply rate of the group II atoms onto the crystal surface is different from that of the group VI atoms, the group II and the Group VI atoms are taken into the solid at the ratio of about 1 to 1 to thereby advance the crystal growth. Those excessive atoms of either of the two groups which adhere to the crystal surface but are not taken, as crystal, into the solid come out of the crystal surface. And the ratio of atoms of the both groups which are taken into the solid becomes slightly different from that of 1 to 1, depending upon how much the atoms of either of the two groups are excessive. This slight difference is kept as the group II or VI vacancies in the crystal. In a case where the group II vacancies are to be introduced into the crystal, therefore, it is preferable that the ratio of the substantial supply rate of the group VI atoms relative to the group II atoms is set large.

The ratio of the substantial material supply rates is usually different from that of the apparent material supply rates. However various conditions such as the crystal growing method, materials used, crystal growing apparatus and requisite may be changed, it is easy to set the ratio of the substantial material supply rates at a value needed. When the rate of the supplied material of one of the groups II and VI is changed while keeping the rate of the other group supplied material certain, the growing rate of crystal is divided into an area where it increases linearly and another area where it is saturated at a certain value, as shown in FIG. 3. The crystal growth is controlled, at the area where the growing rate of crystal increases linearly, by the supply of atoms of that group whose supply rate has been changed, that is, this area tells us that the supply of atoms of the other group whose supply rate is kept certain is excessive. The crystal growth is controlled, at the other area where the growing rate of crystal is saturated at a certain value, by the supply of atoms of the other group whose supply rate is not changed, that is, this other area tells us that the supply of atoms of that group whose supply rate has been changed is excessive. It must be supposed that the supply rate of atoms of the group II is equal to that of atoms of the group VI at the crossing point of the tangential line at the area where the growing rate of crystal increases linearly and that at the other area where it is saturated at the certain value. If the amounts of materials supplied are changed to obtain such a relation as shown in FIG. 3, therefore, the substantial material supply rates can be determined relative to the apparent material supply speeds and the ratio of the substantial supply rate of the group VI atoms relative to that of the group II atoms can be set larger than 1, however various conditions such as the crystal growing method and apparatus, materials used, and crystal growing requisite may be changed.

EXAMPLE 1

Figure 4:
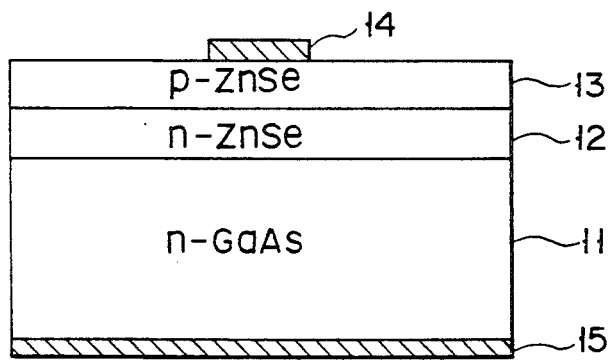
FIG. 4 is a sectional view showing the component structure of a first light-emitting diode according to the present invention.

FIG. 4 is a sectional view showing the structure of a first example of the semiconductor device according to the present invention. This semiconductor device is a ZnSe blue light emitting diode of the pn junction injection current luminescent type. Reference numeral 11 represents an Si-doped n-type GaAs substrate, on which an n-type ZnSe layer 12 and a p-type ZnSe layer 13 are grown. An Au electrode 14 is formed on the p-type ZnSe layer 13 and an Au/Ge electrode 15 is formed on the underside of the substrate 11.

The semiconductor was made by epitaxial-growing n- and p-ZnSe according to the MOCVD method.

The Si-doped n-type GaAs substrate crystal 11 having a face orientation (100) and a carrier density of $1 \times 10^{18}$ cm$^{-3}$ was washed at first by an organic solvent and then surface-etched by a mixed solution of sulfuric acid and liquid hydrogen peroxide. This wafer was set on a susceptor of the MOCVD apparatus and the susceptor was heated to 500° C. in atmosphere of hydrogen gas. Diethyl zinc gas, dimethyl selenium gas and 1-chlorooctane gas which were used as the group II and VI materials and as material of n-impurity Cl of the group II were applied to the wafer on this susceptor at flow rates of 20, 18 and 10 $\mu$mol/minute, respectively, to grow the n-type ZnSe layer 12 to a thickness of 4 $\mu$m and the supply of the material gases was stopped.

Immediately after the supply of the material gases was stopped, diethyl zinc gas and dimethyl selenium gas were applied to the wafer at flow rates of 20 and 160 $\mu$mol/minute and trimethyl gallium gas and O$_2$ gas which were used as materials of Ga of the group III and of impurity oxygen were also applied to the wafer at flow rates of 10 and 10 $\mu$mol/minute to thereby grow the ZnSe layer 13, which was to be formed as p-conductive layer, to a thickness of 4 $\mu$m. The supply of the diethyl zinc, trimethyl gallium and O$_2$ gases was then stopped and the susceptor was lowered to room temperature.

It was when the dimethyl selenium gas flow rate relative to the diethyl zinc gas flow rate became equal to 2 that the effective ratio of VI/II became equal to 1 under the above-mentioned growing conditions. It is therefore recognized that the ZnSe layers 12 and 13 were grown at effective VI/II ratios of 0.45 and 4. Carrier densities of the ZnSe layers 12 and 13 measured according to the electric capacitance—voltage method (or C—V method) were $3 \times 10^{17}$ cm$^{-3}$ in the case of the n-type and $1 \times 10^{17}$ cm$^{-3}$ in the case of the p-type. Densities of the group III impurity and oxygen atoms measured according to the secondary ion mass analysis were $3 \times 10^{17}$ cm$^{-3}$ and $5 \times 10^{17}$ cm$^{-3}$.

The Au/Ge electrode 15 was vapour-deposited on the n-side surface of the GaAs wafer which had been crystal-grown as described above, and the Au electrode 14 was also vapour-deposited on the p-side surface thereof. The wafer was then cut like a chip and molded by epoxy resin. A light-emitting diode was thus made. When voltage of 3.2V was applied to this diode in the forward direction under normal temperature, current of 20mA flowed therethrough and the diode emitted blue light whose center wavelength was 470nm and whose luminous intensity was 10mcd.

According to this example, therefore, a p-type conductive layer having a high carrier density of $1 \times 10^{17}$ cm$^{-3}$ but a low resistance which are requisites needed to make the practical semiconductor device has been made available even in the case of the group II-VI compound semiconductors (or ZnSe in this case) whose forbidden band is wide or larger than 2.5eV. Diffusions of the group III or VII impurity and oxygen atoms and the group II vacancy forming the complex center of the group III or VII impurity atom - oxygen atom - group II vacancy which creates the p-carrier of the p-type conductive layer made according to the above-described example of the present invention are extremely less than that of Li. It has therefore become possible to form the p-n junction at a desired position in the crystal under better control. This enables semiconductor devices each having more excellent characteristics to be produced and their productivity to be further enhanced.

EXAMPLE 2

Figure 5:
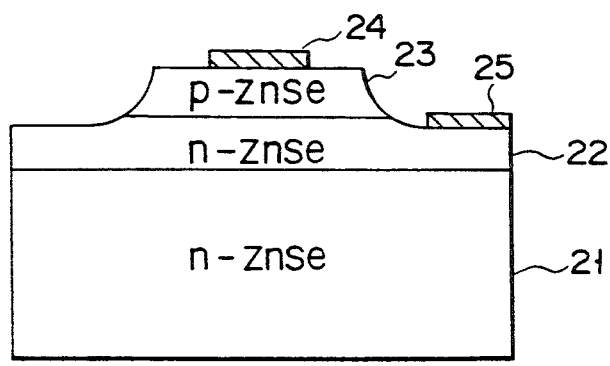
FIG. 5 is a sectional view showing the component structure of a second light-emitting diode according to the present invention.

FIG. 5 is a sectional view showing the structure of a second example of the semiconductor device according to the present invention, in which the single crystal of ZnSe was used as the substrate.

An n-type ZnSe substrate 21 whose wafer surface was made to have a (100) face was cleaned by an organic solvent and its crystal surface was then etching-removed by about 4 μm, using a mixed solution of bromine and methanol. The wafer thus made was then placed on the susceptor of the MOCVD apparatus and heated to 400° C. under atmosphere of hydrogen. It was then heated to 600° C. while applying dimethyl selenium gas to it at a flow rate of 18 μmol/minute.

After it was heated to 600° C., diethyl zinc gas and hydrogen chloride gas which was used as the n-type impurity material were applied to it at flow rates of 20 and 10 μmol/minute to grow an n-type ZnSe layer 22 to a thickness of 10 μm. O$_2$ gas was further applied to it at a flow rate of 10 mol/minute to grow a p-type ZnSe layer 23 to a thickness of 4 μm. The supply of diethyl zinc, hydrogen chloride and O$_2$ gas was then stopped and the wafer was heated to 800° C., while increasing the flow rate of dimethyl selenium gas by 1 mmol/minute. It was left for one hour under this state and the lowering of its temperature was started. After it was cooled to 400° C., the supply of dimethyl selenium gas was stopped and it was cooled to room temperature.

The process of leaving the wafer under a high temperature of 800° C. while applying dimethyl selenium gas to it in the above-described course of making the semiconductor device corresponds to the heat treatment of it under atmosphere of excessive selenium. When the carrier density of the crystal formed as described above was measured according to the C - V method. The ZnSe layer 23 having a thickness of 4 μm when it was measured from the surface of the crystal was a p-type conductive layer whose carrier density was $0.7 \times 10^{17}$ cm$^{-3}$ and the ZnSe layer 22 having a depth larger than 4 μm was an n-type conductive layer whose carrier density was $3 \times 10^{17}$ cm$^{-3}$.

While leaving the p-type ZnSe layer 23 like a mesa, it was etched by the mixed solution of bromine and methanol until this etching reached the n-type ZnSe layer 22. Au was then vapor-deposited, as a p-side electrode 24, on the surface of the p-type ZnSe layer 23 and an Au/Ge layer was vapor-deposited, as an n-side electrode 25, on the surface of the n-type ZnSe layer 23. The wafer was then cut like a chip and a ZnSe light-emitting diode was thus made. When forward voltage of 3.4V was applied to the diode under normal temperature, current of 20mA flowed therethrough and the diode emitted blue light whose luminous center wavelength was 470nm and whose luminous intensity was 12mcd.

EXAMPLE 3

FIG. 6 is a sectional view showing the structure of a third example of the light-emitting diode according to the present invention.

P-type GaAs was used as the substrate and the crystal growth was carried out by the molecular-beam epitaxy (MBE) apparatus provided with ionization doping means. Zn and Se were grown on a p-GaAs substrate 31, using high purity materials. Methane and diborane gases were mixed, as the p-type impurities, and decomposed by plasma discharge. The product was introduced into the mass separator means, where only ions of boron and carbon (B - C) of the groups III-IV were doped. A p-ZnSe layer 32 which served as the p-type layer was grown to have a thickness of 5 μm and Cl ions were then doped, using chlorine gas, to grow an n-ZnSe layer 33, which served as the n-type layer, on the p-ZnSe layer 32 until it has a thickness same as that of the p-ZnSe layer 32. After the growth of the n-ZnSe layer 33 was finished, an alloy of In and Ga was placed on the surface of the n-ZnSe layer 33 and Au was vapor-deposited on the p-GaAs substrate. Then they were heat-treated at a temperature of 350° C., n- and p-side electrodes 34 and 35 which served as ohmic contacts were formed. It has been found that the intermediate product used as a compound of (B - C) is useful to realize the present invention because its union between B and C was stable and hardly broken.

FIG. 7 is a comparison relating to the current - voltage characteristics of the conventional diode and of the third diode of the present invention. Diffusion voltage and resistance value in the forward direction were high in the case of the conventional diode, but when the present invention was employed, the diffusion voltage became almost equal to the theoretically predicted value and the forward resistance became lower.

Figure 8:
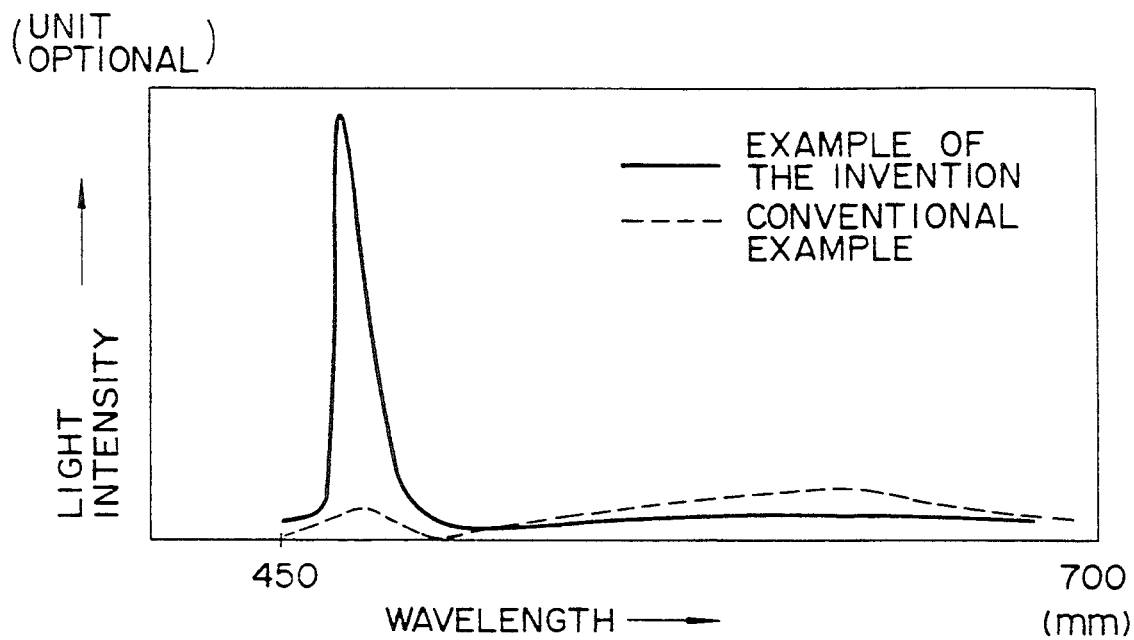
FIG. 8 is a chart showing emission spectra of the conventional diode and of the third diode according to the present invention.

FIG. 8 shows an emission spectrum of the third diode according to the present invention. As apparent from FIG. 8, more excellent light emission which was remarkably larger in luminous strength at its desired blue area and which was reduced at its deep level was obtained.

Figure 9:
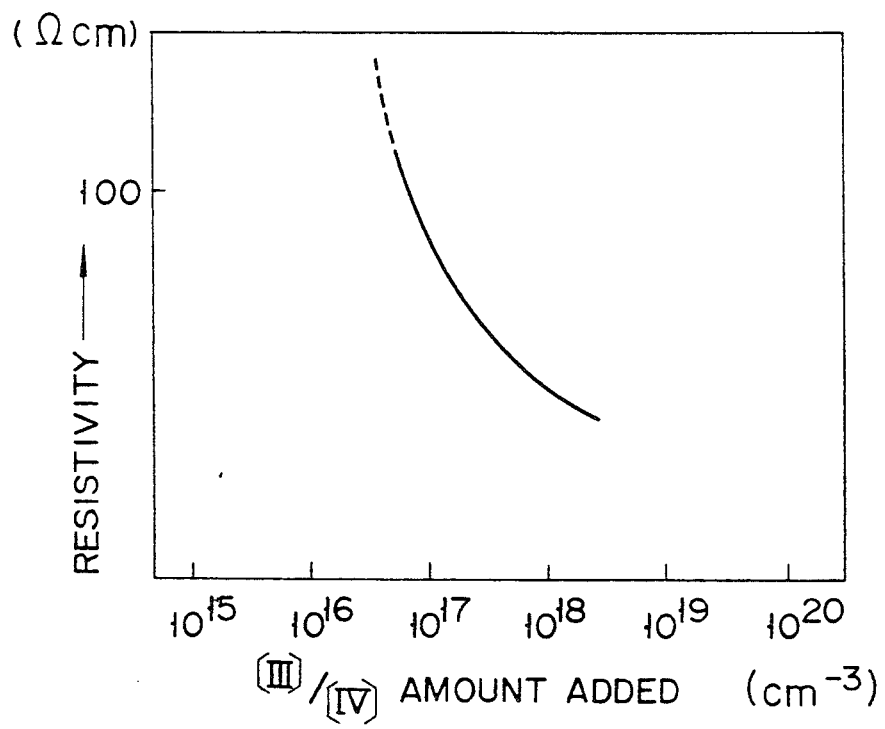
FIG. 9 is a chart showing the correlation of the amount of impurities added relative to the resistivity of p-layer in the case of the third light-emitting diode according to the present invention.

FIG. 9 shows the interrelation between the amount of impurities added and the resistivity of the p-layer. When the density of the group III and IV materials added is larger than $1 \times 10^{10} cm^{-3}$, it is recognized that the resistance value of the p-layer is lowered. When the density is so large, therefore, it has been found that the present invention is useful.

EXAMPLE 4

Figure 10:
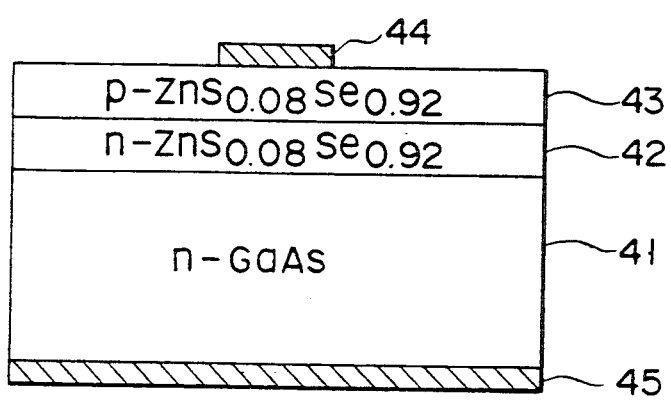
FIG. 10 is a sectional view showing the component structure of a fourth light-emitting diode according to the present invention.

FIG. 10 is a sectional view showing the structure of a fourth example of the semiconductor device according to the present invention. This semiconductor device is a ZnSSe blue light emitting diode of the pn junction injection current luminescent type. Reference numeral 41 represents an Si-doped n-type GaAs substrate, on which an n-type $ZnS_{0.08}Se_{0.92}$ layer 42 and a p-type $ZnS_{0.08}Se_{0.92}$ layer 43 are grown. An Au electrode 44 is formed on the P-type ZnSSe layer 43 and an Au/Ge electrode 45 is formed on the underside of the substrate 41.

The semiconductor was made by epitaxial-growing n- and p-$ZnS_{0.08}Se_{0.09}$ according to the MOCVD method.

The Si-doped n-type GaAs substrate crystal 41 having a face orientation (100) and a carrier density of $1 \times 10^{18} cm^{-3}$ was washed at first by an organic solvent and then surface-etched by a mixed solution of sulfuric acid and liquid hydrogen peroxide. This wafer was set on a susceptor of the MOCVD apparatus and the susceptor was heated to 500° C. in atmosphere of hydrogen gas. Diethyl zinc gas, dimethyl selenium gas, dimethyl sulfide gas, and 1-chlorooctane gas which were used as the group II, VI and VI materials and as material of n-impurity Cl of the group II were applied to the wafer on this susceptor at flow rates of 20, 18, 20 and 10 μmol/minute, respectively, to grow the n-type ZnSSe layer 42 to a thickness of 4 μm and the supply of the material gases was stopped.

Immediately after the supply of the material gases was stopped, diethyl zinc gas, dimethyl selenium gas and dimethyl sulfide gas were applied to the wafer at flow rates of 20, 160 and 160 μmol/minute and silicon oxychloride (SiOCl) gas and $O_2$ gas were also applied to the wafer at flow rates of 10 and 10 μmol/minute to thereby grow the ZnSSe layer 43, which was to be formed as p-conductive layer, to a thickness of 4 μm. The supply of the diethyl zinc, silicon oxychloride and $O_2$ gases was then stopped and the susceptor was lowered to room temperature.

It was when the dimethyl selenium and dimethyl sulfide gases flow rate relative to the diethyl zinc gas flow rate became equal to 4 that the effective ratio of VI/II became equal to 1 under the above-mentioned growing conditions. It is therefore recognized that the ZnSSe layers 42 and 43 were grown at effective VI/II ratios of 0.48 and 4. Carrier densities of the $ZnS_{0.08}Se_{0.92}$ layers 42 and 43 measured according to the electric capacitance - voltage method (or C - V method) were $4 \times 10^{17} cm^{-3}$ in the case of the n-type and $0.8 \times 10^{17} cm^{-3}$ in the case of the p-type. Densities of chlorine, silicon and oxygen atoms measured according to the secondary ion mass analysis were $4 \times 10^{17} cm^{-3}$, $5 \times 10^{17} cm^{-3}$ and $6 \times 10^{17} cm^{-3}$.

It should be understood that the present invention is not limited to the above-described examples. Although the MOCVD method or the MBE method has been used to develop the crystal growth in each of the examples, the present invention can be applied to any of those cases where various crystal growing methods including other MBE and CVD methods are employed. Various other materials except those of the group II and VI atom materials, the group III or VII impurity material and the oxygen material which were used by the above-described examples may be used. The present invention can also be applied to various group II-VI compound semiconductors including those of wide forbidden band, such as ZnS, a mixed crystal of ZnSSeTe, CdZnS or CdZnSe, and etc., in addition to ZnSe and the mixed crystal of ZnSe. In the case of the conventional semiconductor such as HgCdTe, p-n control was carried out using lattice defects, but this p-n control has become easier by the present invention. Further, the present invention can be applied to those semiconductor devices which must be the group II-VI group compound semiconductors and which need the p-type conductive layer, such as the semiconductor laser and the photodetector element, in addition to the light-emitting diode described above as the examples of the present invention.

Although B was used in the third example of the present invention, lattice distortion becomes the slightest and doping efficiency becomes higher when Ga is used as the group III impurity and Ge as the group IV impurity.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

We claim:

1. An optical semiconductor device provided with a p-type group II-VI compound semiconductor layer wherein dopants selected from group VII atoms, atoms of groups III and IV, and atoms of groups IV and VII are added and associations are formed so that shallow acceptor level can be defined, each of the associations is selected from the group IV atom and the group III atom, the group IV atom and group VII atom, and the group VII atom and a vacancy of a group II atom, and is formed between those lattice points which are adjacent to each other.

2. The optical semiconductor device according to claim 1, wherein the density of each of the doped atoms is larger than $1 \times 10^{17}$ cm$^{-3}$.

3. The optical semiconductor device according to claim 1, wherein the dopants are selected from atoms of the groups III and IV and atoms of the groups IV and VII and the density of the group IV atom in the semiconductor layer is substantially equal to or larger than that of the group III or VII atom therein.

4. The optical semiconductor device according to claim 1, wherein the semiconductor layer consists of ZnSe or a mixed crystal of ZnSe.

5. The optical semiconductor device according to claim 4, wherein B and C atoms are added to the semiconductor layer and the acceptor level in the semiconductor layer is defined by the association of the B atom by which the lattice point of Zn is displaced and the C atom by which the lattice point of Se is displaced.

6. The optical semiconductor device according to claim 4, wherein Si and Cl atoms are added to the semiconductor layer and the acceptor level in the semiconductor layer is defined by the association of the Si and Cl atoms by which the lattice points of Se are displaced.

7. The optical semiconductor device according to claim 4, wherein the Cl atom is added to the semiconductor layer and the acceptor level in the semiconductor layer is defined by the association of the Cl atom by which the lattice point of Se is displaced and the vacancy of Zn.

8. An optical semiconductor device provided with a p-type group II-VI compound semiconductor layer wherein dopants selected from group III and oxygen atoms, group VII and oxygen atoms, atoms of the groups III and IV and oxygen atoms, and atoms of the groups IV and VII and oxygen atom are added and associations are formed so that a shallow acceptor level can be defined, each of the associations is selected from the group IV atom, group III and oxygen atom, the group IV atom, group VII atom and oxygen atom, the group III atom, oxygen atom and a vacancy of a group II atom, and the group VII atom, oxygen atom and a vacancy of a group II atom, and is formed between those lattice points which are adjacent to each other.

9. The optical semiconductor device according to claim 8, wherein the density of each of the doped atoms is larger than $1 \times 10^{17}$ cm$^{-3}$.

10. The optical semiconductor device according to claim 8, wherein the dopants are selected from atoms of the groups III and IV and oxygen atom and atoms of the groups IV and VII and oxygen atom, and the density of the group IV atom in the semiconductor layer is substantially equal to or larger than that of the group III or VII atom.

11. The optical semiconductor device according to claim 8, wherein the semiconductor layer consists of ZnSe or a mixed crystal of ZnSe.

12. The optical semiconductor device according to claim 11, wherein B, C and O atoms are added to the semiconductor layer and the acceptor level in the semiconductor layer is defined by the association of the B atom by which the lattice point of Zn is displaced, the C atom by which the lattice point of Se is displaced and the O atom by which the lattice point of Se is displaced.

13. The optical semiconductor device according to claim 11, wherein Si, Cl and O atoms are added to the semiconductor layer and the acceptor level in the semiconductor layer is defined by the association of the Si, Cl and O atoms by which the lattice points of Se are displaced.

14. The optical semiconductor device according to claim 11, wherein Ga and O atoms are added to the semi-conductor layer and the acceptor level in the semiconductor layer is defined by the association of the Ga atom by which the lattice point of Zn is displaced, the vacancy of Zn and the O atom by which the lattice point of Se is displaced.

15. The optical semiconductor device according to claim 11, wherein Cl and O atoms are added to the semi-conductor layer and the acceptor level in the semiconductor layer is defined by the association of the Cl atom by which the lattice point of Se is displaced, the vacancy of Zn and the O atom by which the lattice point of Se is displaced.

16. An optical semiconductor device provided with a p-type compound semiconductor layer of ZnSe or of a mixed crystal of ZnSe wherein dopants selected from group III and oxygen atoms, group VII and oxygen atoms, atoms of the groups III and IV and oxygen atoms, and atoms of the groups IV and VII and oxygen atom are added and associations are formed so that a shallow acceptor level can be defined, each of the associations is selected from the group IV atom, group III atom and oxygen atom, the group IV atom, group VII atom and oxygen atom, the group III atom, oxygen atom and a vacancy of a group II atom, and the group VII atom, oxygen atom and a vacancy of a group II atom, and is formed between those lattice points which are adjacent to each other.

17. The optical semiconductor device according to claim 16, wherein B, C and O atoms are added to the semiconductor layer and the acceptor level in the semiconductor layer is defined by the association of the B atom by which the lattice point of Zn is displaced, the C atom by which the lattice point of Se is displaced and the O atom by which the lattice point of Se is displaced.

18. The optical semiconductor device according to claim 16, wherein Si, Cl and O atoms are added to the semiconductor layer and the acceptor level in the semiconductor layer is defined by the association of the Si, Cl and O atoms by which the lattice points of Se are displaced.

19. The optical semiconductor device according to claim 16, wherein Ga and O atoms are added to the semiconductor layer and the acceptor level in the semiconductor layer is defined by the association of the Ga atom by which the lattice point of Zn is displaced, the vacancy of Zn and the O atom by which the lattice point of Se is displaced.

20. The optical semiconductor device according to claim 16, wherein Cl and O atoms are added to the semiconductor layer and the acceptor level in the semiconductor layer is defined by the association of the Cl atom by which the lattice point of Se is displaced, the vacancy of Zn and the O atom by which the lattice point of Se is displaced.

* * * * *